United States Patent
Fukui et al.

(10) Patent No.: US 8,816,324 B2
(45) Date of Patent: Aug. 26, 2014

(54) SEMICONDUCTOR DEVICE AND METHOD FOR MANUFACTURING SEMICONDUCTOR DEVICE

(75) Inventors: Takashi Fukui, Sapporo (JP); Katsuhiro Tomioka, Sapporo (JP); Junichi Motohisa, Sapporo (JP); Shinjiroh Hara, Sapporo (JP)

(73) Assignees: National University Corporation Hokkaido University, Hokkaido (JP); Sharp Kabushiki Kaisha, Osaka (JP)

( * ) Notice: Subject to any disclaimer, the term of this patent is extended or adjusted under 35 U.S.C. 154(b) by 36 days.

(21) Appl. No.: 13/581,242

(22) PCT Filed: Feb. 23, 2011

(86) PCT No.: PCT/JP2011/053909
§ 371 (c)(1),
(2), (4) Date: Aug. 24, 2012

(87) PCT Pub. No.: WO2011/105397
PCT Pub. Date: Sep. 1, 2011

(65) Prior Publication Data
US 2012/0313078 A1    Dec. 13, 2012

(30) Foreign Application Priority Data
Feb. 25, 2010 (JP) .................. 2010-040019

(51) Int. Cl.
*H01L 29/06* (2006.01)
(52) U.S. Cl.
USPC .............. 257/14; 257/E29.07; 257/E29.069; 438/479
(58) Field of Classification Search
USPC .............. 257/14, E29.07, E29.069; 438/479
See application file for complete search history.

(56) References Cited

U.S. PATENT DOCUMENTS

| 6,670,638 | B2 | 12/2003 | Tamura et al. |
| 2005/0006673 | A1 | 1/2005 | Samuelson et al. |
| 2010/0065809 | A1 | 3/2010 | Lee et al. |

FOREIGN PATENT DOCUMENTS

| JP | 2002-100568 A | 4/2002 |
| JP | 2009-49209 A | 3/2009 |
| JP | 2009-129941 A | 6/2009 |
| JP | 2009-147140 A | 7/2009 |
| JP | 2010-37184 A | 2/2010 |
| WO | 2004/088755 A1 | 10/2004 |
| WO | 2008/079079 A1 | 7/2008 |
| WO | 2008/129861 A1 | 10/2008 |

OTHER PUBLICATIONS

Fukui et al. "Formation of Compound Semiconductor Nanowire and Its Device Application", Kansai University Sentan Kagaku Gijutsu Symposium Koenshu, Jan. 25, 2010, p. 409-414.
Tomioka et al., "Monolithic Integration of AlGaA5/GaAs Core-Shell Nanowire-Based LED Array on Si Substrate", The Japan Society of Applied Physics, Sep. 8, 2009, 11a-P8-30,vol. 70th. No. 3, p. 1106.

*Primary Examiner* — Amar Movva
(74) *Attorney, Agent, or Firm* — Birch, Stewart, Kolasch & Birch, LLP

(57) ABSTRACT

Disclosed is a semiconductor device (10) which comprises a glass substrate (12), a lower electrode layer (14), an n-type doped polycrystalline silicon semiconductor layer (16), a low-temperature insulating film (20) in which openings (22, 23) that serve as nuclei for growth of a nanowire (32) are formed, the nanowire (32) that is grown over the low-temperature insulating film (20) and has a core-shell structure, an insulating layer (50) that surrounds the nanowire (32), and an upper electrode layer (52). The nanowire (32) comprises an n-type GaAs core layer and a p-type GaAs shell layer. Alternatively, the nanowire can be formed as a nanowire having a quantum well structure, and InAs that can allow reduction of the process temperature can be used for the nanowire.

12 Claims, 10 Drawing Sheets

SEMICONDUCTOR DEVICE AND METHOD FOR MANUFACTURING SEMICONDUCTOR DEVICE

TECHNICAL FIELD

The present invention relates to a semiconductor and a manufacturing method thereof, and in particular, to a semiconductor device having a nanowire which extends over polycrystalline silicon provided over a glass or film-like substrate, and a manufacturing method thereof.

BACKGROUND ART

It is well-known from the related art to grow a semiconductor layer over a semiconductor substrate in a pillar shape with a narrow diameter and a height which is sufficiently long compared the diameter. A structure in which the diameter is narrowed to few tens of nanometers is known as a semiconductor nanowire or simply a nanowire. Formation of a pn junction or the like in the semiconductor nanowire to obtain a light-emitting element is also being researched.

For example, Patent Literature 1 discloses that a pn junction is formed in a long axis direction, which is a growth direction, of the semiconductor nanowire to form a light-emitting element. Patent Literature 2 and Patent Literature 3 disclose methods of manufacturing a light-emitting element having a quantum well structure in the nanowire. Patent Literature 4 and Patent Literature 5 disclose a light-emitting element having a pin junction in a growth direction of the nanowire. Patent Literature 6 discloses a method of manufacturing a light-emitting array having a red light-emitting element, a green light-emitting element, and a blue light-emitting element by simultaneously forming a plurality of semiconductor nanowires having different compositions and different band gaps from each other over one substrate.

As a technique related to the present invention, Patent Literature 7 discloses a thin film semiconductor element in which, for an amorphous silicon film provided over a substrate, after a natural oxide film is removed, the structure is immersed in a $H_2O_2$ solution for a short period of time to newly form an oxide film of a very thin thickness, and a laser annealing process is applied through the oxide film to crystallize the film. With such a configuration, the crystal grain size can be set to about 200 nm to about 300 nm, and a percentage of the (111)-orientation can be significantly improved. Here, in an X-ray diffraction measurement, {(111) diffraction intensity/(220) diffraction intensity}=(111)-orientation percentage. Patent Literature 7 discloses that, while the (111)-orientation percentage is about 1.8 when the crystals of polycrystalline silicon are completely randomly oriented, the (111)-orientation percentage can be improved to 60 with the above-described process.

RELATED ART REFERENCES

Patent Literature

[Patent Literature 1] US Patent Publication No. 2005/006673
[Patent Literature 2] International Publication No. 2004/088755
[Patent Literature 3] International Publication No. 2008/079079
[Patent Literature 4] JP 2009-129941 A
[Patent Literature 5] JP 2009-147140 A
[Patent Literature 6] JP 2009-049209 A
[Patent Literature 7] JP 2002-100568 A

DISCLOSURE OF INVENTION

Technical Problem

Most of the nanowires of the related art are structures grown over a single-crystalline semiconductor substrate. If a light-emitting element using the nanowire can be formed over, for example, a glass substrate or a film-like substrate, alight-emitting element array of a large area can be realized.

An advantage of the present invention is provision of a semiconductor device having a plurality of nanowires over a glass substrate or a film-like substrate and a manufacturing method thereof.

Solution to Problem

According to one aspect of the present invention, there is provided a semiconductor device comprising a glass or film-like substrate, a polycrystalline silicon semiconductor layer formed with a (111)-plane parallel to a plane of the substrate, an insulating film with openings which covers the (111)-plane of the polycrystalline silicon semiconductor layer and in which a plurality of openings having a smaller area than an area of crystal grain of polycrystalline silicon over the (111)-plane are formed, and a plurality of nanowires which are formed of a III-V family compound semiconductor and which extend vertical to the (111)-plane of the polycrystalline silicon semiconductor layer at the opening of the insulating film with openings serving as a nucleus.

According to another aspect of the present invention, preferably, in the semiconductor device, the nanowire is a nanowire having a core-shell structure and comprises a core layer which extends vertical to the (111)-plane of the polycrystalline silicon semiconductor layer from the opening of the insulating film with openings, and at least one shell layer which extends in a radial direction vertical to a longitudinal direction of the core layer and which covers the core layer.

According to another aspect of the present invention, preferably, in the semiconductor device, the nanowire comprises a core layer which is formed of a III-V family compound semiconductor having a first conductivity type, and a shell layer which is formed of a III-V family compound semiconductor having a second conductivity type.

According to another aspect of the present invention, preferably, in the semiconductor device, the nanowire comprises a core layer which is formed of a III-V family compound semiconductor having a first conductivity type, a first shell layer which is formed of a III-V family compound semiconductor including a quantum well layer, and a second shell layer which is formed of a III-V family compound semiconductor having a second conductivity type.

According to another aspect of the present invention, preferably, the semiconductor device further comprises a lower electrode layer which is provided between the substrate and the polycrystalline silicon semiconductor layer, and an upper electrode layer which is formed of a transparent conductive material and which covers the shell layer.

According to another aspect of the present invention, preferably, the semiconductor device further comprises a lower electrode layer which is provided between the substrate and the polycrystalline silicon semiconductor layer, and an upper electrode layer which is formed of a transparent conductive material and which covers the second shell layer.

According to anther aspect of the present invention, there is provided a method of manufacturing a semiconductor device, comprising a step of forming a polycrystalline silicon semiconductor layer with a (111)-plane parallel to a plane of a glass or film-like substrate, a step of forming an insulating film with openings which covers the (111)-plane of the polycrystalline silicon semiconductor layer and in which a plurality of openings having a smaller area than an area of crystal grain of polycrystalline silicon over the (111)-plane are formed, and a nanowire forming step in which a plurality of nanowires which are formed of a III-V family compound semiconductor and which extend vertical to the (111)-plane of the polycrystalline silicon semiconductor layer are formed at the opening of the insulating film with openings serving as a nucleus, wherein the nanowire forming step comprises a step of executing a low-temperature thermal process under a predetermined condition which is defined in advance, to convert from the (111)-plane of the polycrystalline silicon semiconductor layer into a (111)-1×1-plane in which a minimum unit of forming an atomic arrangement is 1 atomic distance×1 atomic distance, and a step of supplying a material including a III family element or a material including a V family element, to convert from the (111)-1×1-plane of the polycrystalline silicon semiconductor layer into a (111)-A-plane in which the minimum unit of forming the atomic arrangement is 2 atomic distances×2 atomic distances and the III family element is placed on a surface or a (111)-B-plane in which the minimum unit of forming the atomic arrangement is 2 atomic distances×2 atomic distances and the V family element is placed on a surface.

According to another aspect of the present invention, preferably, in the manufacturing method of a semiconductor device, the nanowire forming step comprises a core layer forming step in which a core layer which extends vertical to the (111)-plane of the polycrystalline silicon semiconductor layer from the opening of the insulating film with openings is formed, and a shell layer forming step in which at least one shell layer which extends in a radial direction vertical to a longitudinal direction of the core layer and which covers the core layer is formed.

According to another aspect of the present invention, preferably, in the manufacturing method of a semiconductor device, the nanowire forming step comprises a core layer forming step in which a core layer which is formed of a III-V family compound semiconductor having a first conductivity type is formed, and a shell layer forming step in which a shell layer which is formed of a III-V family compound semiconductor having a second conductivity type is formed.

According to another aspect of the present invention, preferably, in the manufacturing method of a semiconductor device, the nanowire forming step comprises a core layer forming step in which a core layer which is formed of a III-V family compound semiconductor having a first conductivity type is formed, a first shell layer forming step in which a first shell layer which is formed of a III-V family compound semiconductor including a quantum well layer is formed, and a second shall layer forming step in which a second shell layer which is formed of a III-V family compound semiconductor having a second conductivity type is formed.

According to another aspect of the present invention, preferably, the manufacturing method of a semiconductor device further comprises a step of providing a lower electrode layer between the substrate and the polycrystalline silicon semiconductor layer, and a step of providing an upper electrode layer which is formed of a transparent conductive material and which covers the shell layer.

According to another aspect of the present invention, preferably, the manufacturing method of a semiconductor device further comprises a step of providing a lower electrode layer between the substrate and the polycrystalline silicon semiconductor layer, and a step of providing an upper electrode layer which is formed of a transparent conductive material and which covers the second shell layer.

Advantageous Effects of Invention

With at least one of the above-described configurations, in the semiconductor device, over a polycrystalline silicon semiconductor layer formed with a (111)-plane parallel to a plane of a glass or film-like substrate, an insulating film with openings which covers the (111)-plane of the polycrystalline silicon semiconductor layer and in which a plurality of openings having a smaller area than an area of crystal grain of polycrystalline silicon over the (111)-plane are formed is provided, and a plurality of nanowires which are formed of a III-V family compound semiconductor and which extend vertical to the (111)-plane of the polycrystalline silicon semiconductor layer at the opening of the insulating film with openings serving as a nucleus are provided. Because the nanowire can be grown over the silicon single-crystalline substrate with the related art, by setting an area of the nucleus of the nanowire to be smaller than an area of crystal grain of the polycrystalline silicon, it is possible to grow a nanowire over the polycrystalline silicon. By executing, in advance, an orientation control to convert the (111)-plane of polycrystalline silicon into a (111)-A-plane or a (111)-B-plane in which a III-V compound semiconductor grows vertical to the surface, it is possible to grow the nanowire vertical to the plane of the polycrystalline silicon.

In addition, in the semiconductor device, the nanowire is a nanowire having a core-shell structure and comprises a core layer and at least one shell layer which extends in a radial direction vertical to a longitudinal direction of the core layer and which covers the core layer. With the use of the core-shell structure, a plurality of junction structures can be formed in the radial direction of the nanowire. For example, when the light-emitting element of the nanowire is to be formed with the core-shell structure, because the light emission occurs at the junction portion, the light emission is caused along the longitudinal direction of the core-shell structure. In other words, the light emission is caused in the direction vertical to the substrate, and thus the structure is well-suited, for example, to a light-emitting array of a large area.

Moreover, in the semiconductor device, because the nanowire comprises a core layer which is formed of a III-V family compound semiconductor having a first conductivity type and a shell layer which is formed of a III-V family compound semiconductor having a second conductivity type, the pn junction can be formed in the radial direction of the nanowire and can be used as the light-emitting element or the like.

Furthermore, in the semiconductor device, because the nanowire comprises a core layer which is formed of a III-V family compound semiconductor having a first conductivity type, a first shell layer which is formed of a III-V family compound semiconductor including a quantum well layer, and a second shell layer which is formed of a III-V family compound semiconductor having a second conductivity type, a laser diode which emits light along a longitudinal direction of the nanowire can be formed.

In addition, because the semiconductor device further comprises a lower electrode layer which is provided between the substrate and the polycrystalline silicon semiconductor layer, and an upper electrode layer which is formed of a transparent conductive material and which covers the shell layer, a suitable drive circuit can be connected between the electrode layers to drive the device formed in the core-shell structure. When the shell layer is formed in a configuration having the first shell layer and the second shell layer, the second shell layer can be covered with the upper electrode layer, to achieve similar driving.

In addition, with at least one of the above-described configurations, in the manufacturing method of a semiconductor device, over a polycrystalline silicon semiconductor layer formed with a (111)-plane parallel to a plane of a glass or film-like substrate, an insulating film with openings which covers the (111)-plane of the polycrystalline silicon semiconductor layer and in which a plurality of openings having a smaller area than an area of crystal grain of polycrystalline silicon over the (111)-plane are formed is provided, and a plurality of nanowires which are formed of a III-V family compound semiconductor and which extend vertical to the (111)-plane of the polycrystalline silicon semiconductor layer are formed at the opening of the insulating film with openings serving as a nucleus. Because a nanowire can be grown over the silicon single-crystalline substrate according to the related art, by setting the area of the nucleus of the nanowire to be smaller than the area of crystal grain of the polycrystalline silicon, it is possible to grow the nanowire over the polycrystalline silicon.

In addition, prior to the formation of the nanowire, a low-temperature thermal process is executed under a predetermined condition which is defined in advance, to convert from the (111)-plane of the polycrystalline silicon semiconductor layer into a (111)-1×1-plane in which a minimum unit of forming an atomic arrangement is 1 atomic distance×1 atomic distance, and then, a material including a III family element or a material including a V family element is supplied to convert from the (111)-1×1-plane of the polycrystalline silicon semiconductor layer into a (111)-A-plane in which the minimum unit of forming the atomic arrangement is 2 atomic distances×2 atomic distances and the III family element is placed on a surface or a (111)-B-plane in which the minimum unit of forming the atomic arrangement is 2 atomic distances×2 atomic distances and the V family element is placed on a surface. With such a configuration, the (111)-plane of the polycrystalline silicon semiconductor layer can be converted into a plane in which the III-V family compound semiconductor can easily grow vertically, and therefore, it is possible to cause most of the nanowires growing over the polycrystalline silicon semiconductor layer to extend vertical to the polycrystalline silicon semiconductor layer.

BEST MODE FOR CARRYING OUT THE INVENTION

Figure 1:
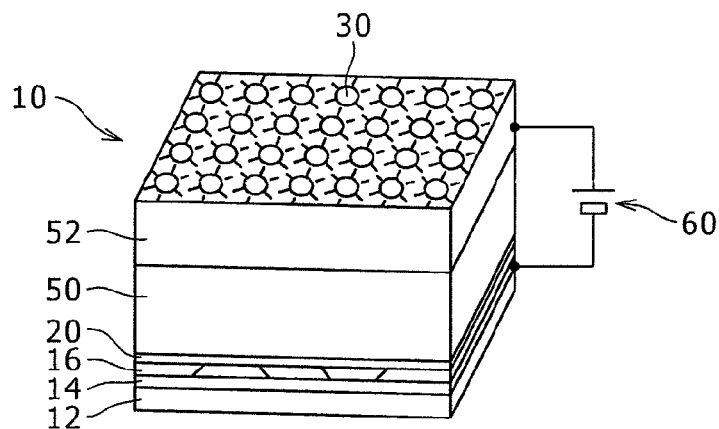
FIG. 1 is a diagram for explaining a structure of a semiconductor device according to a preferred embodiment of the present invention.

Preferred embodiments of the present invention will now be described in detail with reference to the drawings. In the following description, as a semiconductor device, a light-emitting element, a laser diode, and a light receiving element will be described, but alternatively, the present invention can be applied to other elements such as a light source element, a white light source element, a solar cell, a multiple-junction solar cell, a color sensor, a bipolar transistor, a MIS transistor, or the like.

In the following description, a glass substrate will be described as the substrate over which a polycrystalline silicon semiconductor layer is formed, but other substrates may be employed which conform with a temperature or the like in which the polycrystalline silicon can be formed. For example, a plastic sheet, a plastic film, or the like having a suitable heat endurance may be used.

In the following description, as the nanowire, a core-shell structure including a core layer and a shell layer which grows in the radial direction of the core layer will be described, but alternatively, the nanowire may have a structure with no shell layer. In addition, a case will be described in which GaAs, AlGaAs, and InAs are used as a III-V family compound semiconductor forming the nanowire, but alternatively, other III-V family compound semiconductors may be employed.

The III-V family compound semiconductor may be a compound semiconductor made of a plurality of elements such as a binary compound semiconductor, a ternary compound semiconductor, quarternary compound semiconductor, etc. Examples of the binary compound semiconductor other than GaAs and InAs include InP, GaN, InSb, GaSb, and AlSb. Examples of the ternary compound semiconductor other than AlGaAs include InGaAs, InGaN, AlGaN, GaNAs, InAsSb, GaAsSb, InGaSb, and AlInSb. Examples of the quarternary compound semiconductor include AlGaInN, InGaAsP, GaInAsN, InGaAlSb, InGaAsSb, and AlInGaP. When the device is used as the above-described white light source, for example, a structure may be employed in which AlGaN or AlGaInN is formed as a nanowire, and a fluorescent material which converts near-ultraviolet light into white light is applied at a upper portion of the nanowire.

In the following description, GaAs and InAs are described as the III-V family compound semiconductors which grow directly from the polycrystalline silicon semiconductor layer. Both GaAs and InAs have a characteristic that GaAs and InAs grow vertically over a plane of the polycrystalline silicon semiconductor layer which is commonly called a (111)-B-plane. Therefore, in the following description, as the orientation control of the plane of the polycrystalline silicon semiconductor layer executed for growing the nanowire vertically from the polycrystalline silicon semiconductor layer, a case is described in which the (111)-plane of the polycrystalline silicon semiconductor layer is converted into the (111)-B-plane. On the other hand, InP, GaP, InGaP, etc. have a characteristic that these materials grow vertically over a plane of the polycrystalline silicon semiconductor layer known as a (111)-A-plane. Therefore, when these III-V family compound semiconductors are used, as the orientation control of the plane of the polycrystalline silicon semiconductor layer executed for growing the nanowire vertically over the polycrystalline silicon semiconductor layer, the (111)-plane of the polycrystalline silicon semiconductor layer may be converted to the (111)-A-plane.

The (111)-A-plane is a plane in a state where the III family element is connected to $Si^{3+}$ or the V family element is connected to $Si^{1+}$, and the (111)-B-plane is a plane in a state where the V family element is connected to $Si^{3+}$ or the III family element is connected to $Si^{1+}$.

In addition, in the following description, as the core-shell structure, a pn junction structure and a pn junction structure sandwiching a quantum well structure will be described, but alternatively, other multiple-junction structures such as, for example, a npn structure, may be employed. Alternatively, the structure may be GaAs—InGaP, GaAs—AlInGaP, or the like which is known as a structure of a multiple-junction solar cell.

The size, shape, temperature, flow rate, etc. described below are merely exemplary for the purpose of explanation, and may be suitably changed according to the specification of the semiconductor device.

In the following description, elements that are the same in all drawings are assigned the same reference numerals and will not be repeatedly described. In addition, in the description in this document, reference numerals that have been already described will be referred to as necessary.

[First Preferred Embodiment]

Figure 2:
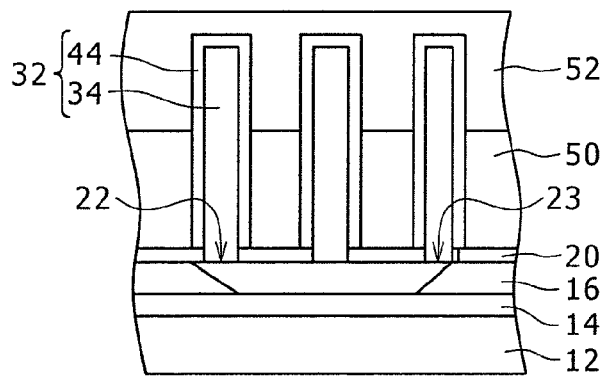
FIG. 2 is a partial cross sectional diagram along a thickness direction of FIG. 1.
Figure 3:
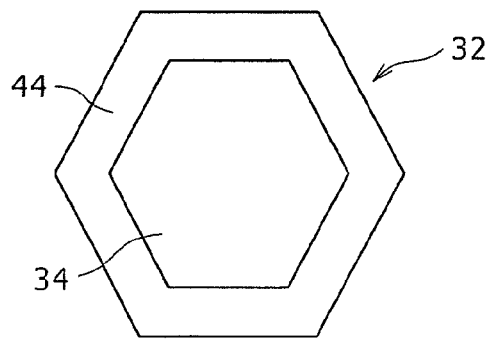
FIG. 3 is a cross sectional diagram in a direction perpendicular to an axial direction of the nanowire in FIG. 1.

A semiconductor device 10 functioning as a pn junction light-emitting element will be described with reference to FIGS. 1-22. FIGS. 1-3 are diagrams for explaining a structure of the semiconductor device 10. FIG. 1 is an overall perspective view of the semiconductor device 10, FIG. 2 is a cross sectional diagram a log a thickness direction of a nanowire 32 having a core-shell structure which does not appear on the front surface in FIG. 1, and FIG. 3 is a cross sectional diagram in a direction perpendicular to the axial direction of the nanowire 32 having the core-shell structure.

The semiconductor device 10 is formed as an infrared light-emitting element by growing a nanowire having a pn junction structure and a core-shell structure over a polycrystalline silicon semiconductor layer formed over a glass substrate. FIG. 1 shows a drive power supply 60 which drives the light-emitting element, although the drive power supply 60 is not a constituent element of the semiconductor device 10, and shows light emission 30 caused by the driving.

The semiconductor device 10 comprises a glass substrate 12, a lower electrode layer 14, a polycrystalline silicon semiconductor layer 16 which is doped to an n-type, a low-temperature insulating film 20 in which openings 22 and 23 serving as nuclei for growth of the nanowire 32 are formed, the nanowire 32 grown over the low-temperature insulating film 20 and having a core-shell structure, an insulating layer 50 covering the surroundings of the nanowire 32, and an upper electrode layer 52.

The nanowire 32 having the core-shell structure has a structure in which an n-type GaAs serving as a core layer 34 and a p-type GaAs serving as a shell layer 44 are layered in a radial direction at the openings 22 and 23 of the low-temperature insulating film 20 serving as nuclei and having a hexagonal cross section slightly larger than the size of the openings 22 and 23, and extends vertically over the surface of the polycrystalline silicon semiconductor layer 16. By two-dimensionally placing the openings 22 and 23 with a constant pitch, the nanowire 32 is two-dimensionally placed as a semiconductor layer bristling in a two-dimensional array shape. The specific size relationship will be described later. By employing a suitable placement size, it is possible to place 100 million or more nanowires 32 per 1 $cm^2$.

Thus, when the lower electrode layer 14 is set at a ground potential and a drive power supply satisfying an injection current condition suitable for light emission by the pn junction GaAs is connected to the upper electrode layer 52, the nanowire 32 emits light. Specifically, the injection current suitable for light emission flows in the order of the upper electrode layer 52, the p-type GaAs shell layer 44, the n-type GaAs core layer 34, the n-type polycrystalline silicon semiconductor layer 16, and the lower electrode layer 14, and with the flow of current, the pn junction GaAs emits light. Alternatively, the placements of the n-type and p-type may be reversed such that the ground potential is connected to the upper electrode layer 52 and the drive power supply is connected to the lower electrode layer 14. In the following description, a configuration is described in which the n-type polycrystalline silicon semiconductor layer 16 is used.

A procedure of the manufacturing method of the semiconductor device 10 having the above-described structure will now be described in detail with reference to FIGS. 4-22. In particular, FIGS. 13-17 are diagrams for explaining a process procedure for forming the nanowire 32 to extend vertically over a surface of the polycrystalline silicon semiconductor layer 16.

Figure 4:
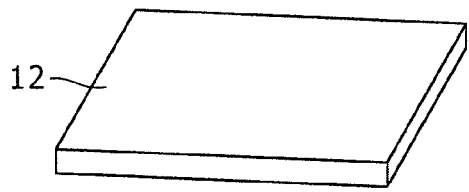
FIG. 4 is a diagram for explaining a procedure of a manufacturing method of a semiconductor device according to a preferred embodiment of the present invention, and shows preparation of a glass substrate.

First, the glass substrate 12 is prepared. FIG. 4 shows a flat glass substrate 12. As the glass substrate 12, a substrate of a known material which is suitable for a formation condition of the polycrystalline silicon semiconductor layer 16 and a formation condition of the nanowire 32 may be used. For example, when the formation temperature of processing temperature is less than or equal to 600° C., glass manufactured by Corning Inc. and known with a product number of 7059, EAGLE XG (registered trademark by Corning Inc.), etc., may be used. When the formation temperature or the processing temperature is about 700° C., glass having a composition including zirconia may be used. When the formation temperature is even higher, a quartz glass may be used.

Here, because the formation temperature of GaAs is 750° C., quartz glass is used as the glass substrate. A thickness of the glass substrate 12 is set to, for example, about 0.7 mm.

Figure 5:
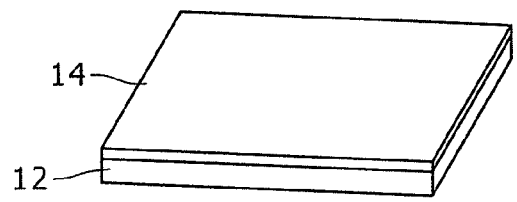
FIG. 5 is a diagram showing formation of a lower electrode layer following FIG. 4.

Next, after the glass substrate 12 is suitably cleaned through washing or the like, the lower electrode layer 14 is formed. FIG. 5 shows this process. The lower electrode layer 14 preferably also has a function to serve as a barrier layer to prevent diffusion of Na or the like from the glass substrate 12 into the polycrystalline silicon semiconductor layer 16. As such a lower electrode layer 14 also having a function as a barrier layer, a thin film metal layer such as a Mo layer, a Cr layer, a Ta layer, or the like may be employed. A thickness of the lower electrode layer 14 may be set to, for example, 100 nm. For the formation of the lower electrode layer 14, evaporation, sputtering, or the like which is known for formation of a thin film metal layer, may be employed.

Alternatively, the function as the barrier layer of the lower electrode layer 14 may be separated, and a barrier layer called a base coat layer may be provided between the glass substrate 12 and the lower electrode layer 14. As the base coat layer, a thin film insulating film such as silicon nitride and tantalum oxide may by used.

Next, the n-type polycrystalline silicon semiconductor layer is formed. This step includes a step of forming an n-type amorphous silicon layer over the lower electrode layer 14 and a step of laser annealing the amorphous silicon layer to form polycrystalline silicon. The orientation of the surface of the polycrystalline silicon semiconductor layer 16 formed in this manner is oriented with priority on the (111)-plane, and as described in Patent Literature 7, a suitable surface process is preferably applied for the amorphous silicon layer prior to the laser annealing process so that most of the planes is set to the (111)-plane. The surface of the polycrystalline silicon semiconductor layer 16 refers to the plane parallel to the surface to the glass substrate 12.

For the formation of the amorphous silicon layer, film formation techniques such as plasma CVD (Chemical Vapor Deposition), LPCVD (Low Pressure CVD), sputtering, evaporation, or the like may be employed. In order to dope the layer into n-type, an n-type impurity such as P may be used. A thickness of the amorphous silicon layer may be set to about 10 nm to about 100 nm, and is preferably set to, for example, 50 nm.

For the laser annealing process, XeCl laser having a wavelength of 308 nm and KrF laser having a wavelength of 248 nm may be used. In place of these lasers, YAG laser or Ar laser may be used. The laser annealing process condition is preferably set to stably maximize the crystal grain size in the (111)-plane of the polycrystalline silicon semiconductor layer 16, so that, for example, the crystal grain size is greater than or equal to 200 nm. Preferably, the condition is set such that the crystal grain size is about 1 μm. In order to obtain such a polycrystalline silicon semiconductor layer 16 with a coarse and large size, a suitable coarsening promotion element such as Ni may be added in a small amount.

Figure 6:
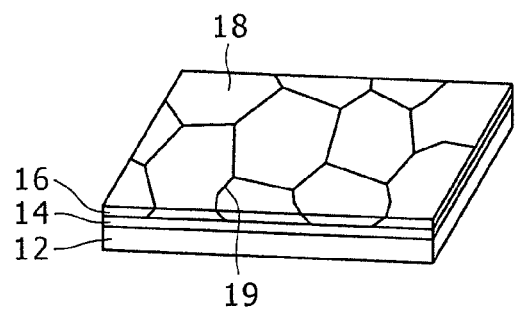
FIG. 6 is a diagram showing formation of a polycrystalline silicon semiconductor layer following FIG. 5.

FIG. 6 shows the n-type polycrystalline silicon semiconductor layer 16 formed in this manner. The polycrystalline silicon semiconductor layer 16 is formed with crystal grains 18 which are surrounded by a grain boundary 19 and are adjacent to each other when the polycrystalline silicon semiconductor layer 16 is viewed from the surface. The orientation of this surface is the (111)-plane, and a value representing the diameter size of the crystal grains 18 observed in this surface is the crystal grain size.

The above-described steps relate to formation of the polycrystalline silicon semiconductor layer 16 over the glass substrate 12, and are a well-known procedure in, for example, a manufacturing method of a liquid crystal cell or the like. Therefore, alternatively, other methods and procedures may be used. When the polycrystalline silicon semiconductor layer 16 is formed with the (111)-plane parallel to the plane of the glass substrate 12 in this manner, the formation step of the nanowire 32 is next executed.

A first step in the formation of the nanowire 32 is formation of the low-temperature insulating film 20. When the polycrystalline silicon semiconductor layer 16 is exposed to the air, a natural oxide film is formed, which inhibits growth of the nanowire 32. Therefore, preferably, using the same apparatus, the low-temperature insulting film 20 is formed continuously from the formation of the polycrystalline silicon semiconductor layer 16 and after replacing the atmosphere with inert gas.

Figure 7:
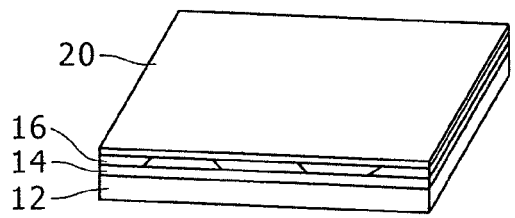
FIG. 7 is a diagram showing formation of a low-temperature insulating film following FIG. 6.

The low-temperature insulating film 20 is an insulating film which is formed at a low temperature that does not affect the polycrystalline silicon semiconductor layer 16 and which covers the (111)-plane of the surface of the polycrystalline silicon semiconductor layer 16. FIG. 7 shows this process. The low-temperature insulating film 20 is a growth inhibiting mask layer having a function such that an opening 22 is formed, the nanowire 32 is grown only at the openings 22 and 23, and the growth of the nanowire 32 is inhibited in a region where the opening 22 is not formed. A thickness of the low-temperature insulating film 20 is set to about 20 nm. As a material of the insulating film, $SiO_2$, $SiN$, $Al_2O_3$, or the like may be used.

Figure 8:
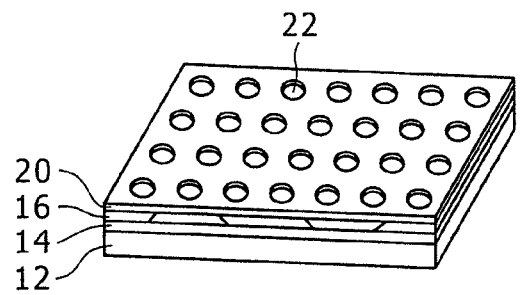
FIG. 8 is a diagram showing formation of a plurality of openings in the low-temperature insulating film following FIG. 7.

Next, a plurality of openings 22 are formed in the low-temperature insulating film 20. FIG. 8 shows this process. As described above, the plurality of openings 22 serve as the nuclei for the growth of the nanowire 32, and penetrate through the low-temperature insulating film 20 such that the polycrystalline silicon semiconductor layer 16 is exposed at the surface. The opening 22 serves as the growth nucleus of the nanowire 32 because while the opening 22 exposes the (111)-plane of the polycrystalline silicon, the (111)-plane of the polycrystalline silicon is not exposed at locations on the low-temperature insulating film 20 in which the opening 22 is not formed. By controlling the exposed locations of the (111)-plane of the polycrystalline silicon, it becomes no longer necessary to use a metal particle or the like as the nucleus of the growth as in the related art.

A shape of the plurality of openings 22 is not particularly limited, and in addition to a circular shape, a polygonal shape such as a triangle, a quadrangle, a hexagon, or the like may be used. The size of each opening 22 may be set in the case of a polygon or the like, for example, to a value between 2 nm and 500 nm in equivalent circle diameter. In this case, the area of the opening 22 must be set to an area smaller than the area of crystal grain of the polycrystalline silicon on the (111)-plane to prevent the grain boundary of the polycrystalline silicon from extending over the opening 22. In the above-described example configuration, the size of the crystal grain may be set to a value between 200 nm and 1 μm, and the equivalent circle diameter of the opening 22 may be set to a value between 50 nm and 100 nm.

The distance between the adjacent openings 22 must be set to a value in consideration of the size of the crystal grain of the polycrystalline silicon described above and such that the insulating layer 50 can easily fill the region between adjacent nanowires 32, as will be described below. In the above-described example configuration, the distance between the adjacent openings 22 may be set to a value between 200 nm and 400 nm. In the following description, a configuration will be described in which the shape of the opening 22 is set to a hexagon, the size is set to 50 nm in the equivalent circle diameter, and the distance between adjacent openings 22 is set to 200 nm. These values are merely exemplary for the purpose of explanation. The shape of the opening 22 is shown in a circle in the drawings in order to simplify the drawings.

For the formation of the plurality of openings 22 in the low-temperature insulating film 20, a fine pattern forming technique such as electron beam lithography, photolithography, nano imprint lithography, etc., may be used. For example, the plurality of openings 22 may be formed using a resist exposure technique by electron beam drawing and a wet chemical etching technique.

Figure 9:
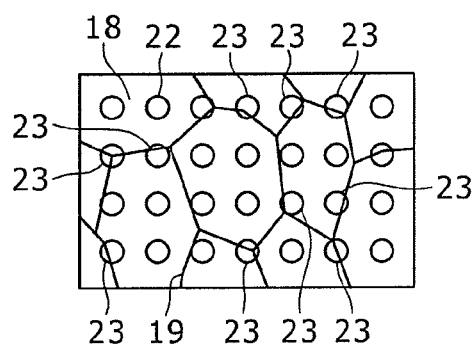
FIG. 9 is a diagram for explaining a relationship between the plurality of openings and polycrystalline silicon in FIG. 8.

FIG. 9 is a diagram explaining a relationship between the plurality of openings 22 and the crystal grain 18 and the grain boundary 19 of the polycrystalline silicon. More specifically, FIG. 9 shows, in an overlapping manner, the surface state of the polycrystalline silicon semiconductor layer 16 described with reference to FIG. 6 and the placement of the plurality of openings 22 described with reference to FIG. 8. As shown, depending on the size of the crystal grain 18 and the opening area and the placement method of the plurality of openings 22, some of the plurality of openings 22 extend over the grain boundary 19. Here, an opening extending over the grain boundary 19 is described as an opening 23 and is distinguished from the opening 22 which does not extend over the grain boundary 19. In the case of the example configuration, of the 28 openings, 10 openings are the openings 23 extending over the grain boundary 19, and 18 openings are the openings 22 which do not extend over the grain boundary 19.

Figure 10:
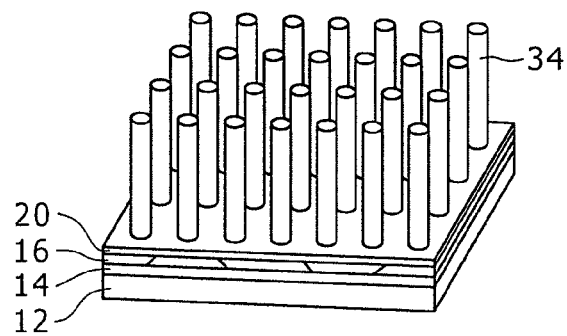
FIG. 10 is a diagram showing growth of a core layer in the nanowire at the opening serving as nucleus of growth, following FIG. 8.
Figure 11:
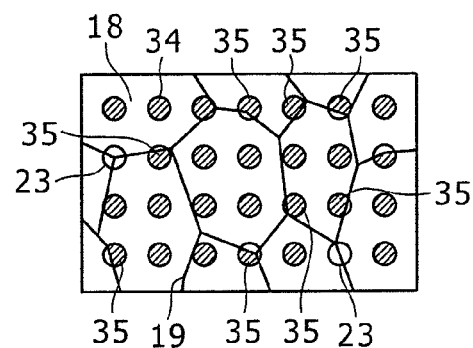
FIG. 11 is a diagram for explaining a relationship between the plurality of the openings, the polycrystalline silicon, and the core layer in FIG. 10.
Figure 12:
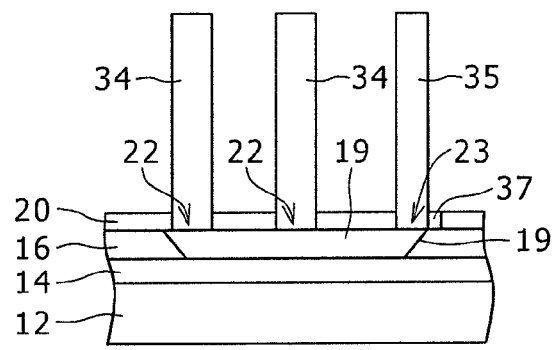
FIG. 12 is a partial cross sectional diagram along a thickness direction of the nanowire in FIG. 10.

When the plurality of openings 22 are formed, next, the core layer 34 forming the nanowire 32 is formed. FIGS. 10-12 show this process. FIG. 10 is a perspective diagram showing formation of the core layer 34, FIG. 11 is a diagram explaining a relationship among the plurality of openings 22 and 23, the grain boundary 19 of polycrystalline silicon, and the core layers 34 and 35, and FIG. 12 is a partial cross sectional diagram along a thickness direction of the core layers 34 and 35.

As shown in FIG. 10, the core layer 34 is formed with the plurality of openings 22 of the low-temperature insulating film 20 as the nuclei of growth and extending vertically with respect to the surface of the polycrystalline silicon semiconductor layer 16. For example, in the above-described example configuration, the equivalent circle diameter of the opening 22 is 50 nm, and the core layer 34 has a hexagonal cross sectional shape with an approximately same size. A height of the core layer 34 can be controlled by controlling the time of formation, and is, for example, a few 100 nm to about 3 μm.

With reference to FIG. 8, in FIG. 11, the core layer 34 corresponding to the opening 22 which does not extend over the grain boundary 19 and the core layer 35 corresponding to the opening 23 which extends over the grain boundary 19 are shown in a distinguishable manner. The core layer 34 corresponding to the opening 22 which does not extend over the grain boundary 19 is grown to a diameter of approximately the same size as the diameter of the opening 22 as described above. This layer will be referred to as the core layer 34 having a normal diameter. With regard to the opening 23 which extends over the grain boundary 19, of the area of the opening 23, the core layer 35 grows toward the crystal grain 18 which occupies a larger area of the areas divided by the grain boundary 19 with the grain boundary 19 therebetween.

For the core layer 35, the diameter may be reduced compared to the core layer 34 with normal diameter. In addition, when each of the areas within the area of the opening 23 divided by the grain boundary 19 with the grain boundary 19 therebetween is approximately ½, there may be cases where no core layer grows.

In the example configuration of FIG. 11, there are 18 core layers 34 with normal diameter corresponding to 18 openings 22 which do not extend over the grain boundary 19 among the 28 openings, and 8 core layers 35 having a smaller diameter than the normal diameter and 2 locations where no core layer grows and the openings 23 are left, corresponding to the 10 openings 23 which extend over the grain boundary 19 among the 28 openings. This configuration is merely exemplary for the purpose of explanation.

FIG. 12 shows core layers 34 and 35 which grow corresponding to the opening 22 which does not extend over the grain boundary 19 and the opening 23 which extends over the grain boundary 19, respectively. As shown in FIG. 12, of the openings 23 extending over the grain boundary 19, no core layer grows in a portion 37 near the grain boundary 19. Therefore, the diameter of the core layer 35 grown corresponding to the opening 23 extending over the grain boundary 19 is smaller than the normal diameter of the core layer 34 grown corresponding to the opening 22 which does not extend over the grain boundary 19. Despite the difference in the diameter, there is almost no difference in the height of the growth between the core layers 34 and 35.

Next, an orientation control of the nanowire growth executed for causing the core layers 34 and 35 to grow vertically over the surface of the polycrystalline silicon semiconductor layer 16 will be described with reference to FIGS. 13-17. The orientation control of the nanowire growth refers to a control of the orientation on the growth surface such that, when the III-V family compound semiconductor is grown from silicon, the III-V family compound semiconductor grows vertically from the surface of silicon.

In the case of a GaAs compound semiconductor, because of the crystal structure, the GaAs compound semiconductor grows over the (111)-A-plane or the (111)-B-plane, and of these planes, the GaAs compound semiconductor grows vertically with respect to the surface when the GaAs compound semiconductor grows over the (111)-B-plane. On contrary, because the crystal structure of silicon does not have such a characteristic, there may be both the growth over the (111)-A-plane and the (111)-B-plane if no measure is taken. Therefore, the orientation of the silicon surface is converted to the plane suitable for the growth of the (111)-B-plane, and if necessary, a process suitable for the growth of the III-V family compound semiconductor is executed on the surface of silicon. This process is the orientation control process of the nanowire growth.

Specifically, in the process, a process to remove the natural oxide film on the surface of the polycrystalline silicon semiconductor layer 16, a low-temperature thermal process for converting from the (111)-plane of the polycrystalline silicon semiconductor layer 16 to the (111)-1×1-plane in which a minimum unit of forming an atomic arrangement is 1 atomic distance×1 atomic distance, and a process to convert from the (111)-1×1-plane of the polycrystalline silicon semiconductor layer 16 into a (111)-B-plane in which the minimum unit of forming the atomic arrangement is 2 atomic distances×2 atomic distances and a V family element is placed on the surface, but not into a (111)-A-plane in which the minimum unit of forming the atomic arrangement is 2 atomic distances×2 atomic distances and a III family element is placed on a surface, are executed. In order to supplement this process, an alternating material supply modulation (Flow rate Modulated Epitaxy) process for forming a thin film of a III-family compound semiconductor is executed as necessary.

The natural oxide film removal process is a process to remove the natural oxide film because, when the natural oxide film exists over the surface of the polycrystalline silicon semiconductor layer 16, the growth of the nanowire 32 is inhibited. As described above, the processes from the formation of the polycrystalline silicon semiconductor layer 16 to the formation of the low-temperature insulating film 20 are executed using the same apparatus so that the polycrystalline silicon semiconductor layer 16 is not exposed to the air. However, there is a possibility that a natural oxide film will be formed when the plurality of openings 22 are formed.

Therefore, in such a case, the glass substrate 12, the polycrystalline silicon semiconductor layer 16, or the like are heated under an allowable temperature and in an inert gas atmosphere such as hydrogen gas, nitrogen gas, argon gas, or the like. With this process, the thin natural oxide film is removed, and at the same time the oxygen atoms are removed from the crystal structure at the interface between silicon and the natural oxide film. In the location where the oxygen atoms are removed, the III family atoms or the V family atoms are adsorbed in place of the oxygen atoms. Alternatively, in place of the heating process under the inert gas atmosphere, various other processing techniques known as suitable very thin oxide film removal process may be used.

Figure 13:
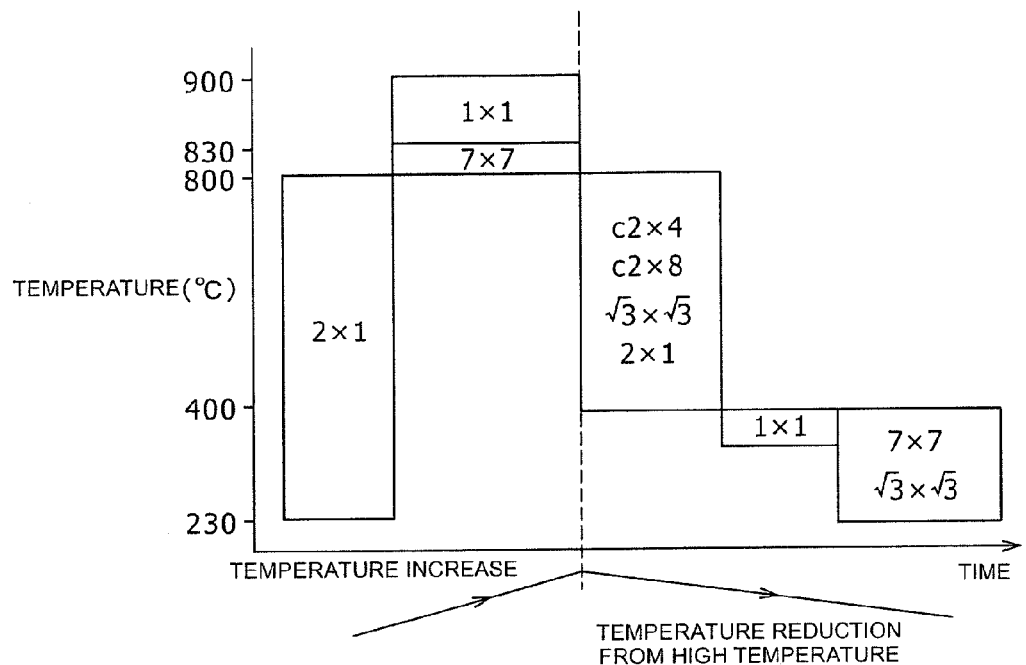
FIG. 13 is a diagram showing a relationship between an atomic arrangement structure of silicon and a growth temperature.

The principle of the low-temperature thermal process will now be described with reference to FIG. 13. FIG. 13 is a diagram showing a relationship of a stabilization plane with respect to the growth temperature. In FIG. 13, the vertical axis represents temperature and the horizontal axis represents elapsed time after the temperature of silicon is increased and then the temperature is reduced from the high temperature. The (111)-plane during the high-temperature thermal process is formed with a 1×1 structure or a 7×7 structure which is an integer multiple of the 1×1 structure. Here, the 1×1 structure refers to a structure in which the minimum unit of forming the atomic arrangement is 1 atomic distance×1 atomic distance, and may be represented as (111)-1×1.

In silicon, the structure which is known to be the most stable is (111)-7×7. Because the III-V family compound semiconductor such as GaAs has a (111)-2×2 structure, the conversion from (111) 1×1 is easy, but the conversion from (111)-7×7 is not easy. Therefore, it is preferable to first form the surface of silicon into the (111)-1×1 structure and then grow the III-V family compound semiconductor.

Figure 14:
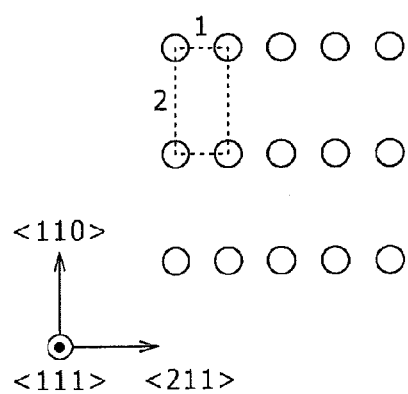
FIG. 14 is a diagram for explaining a (111)-2×1 structure.
Figure 15:
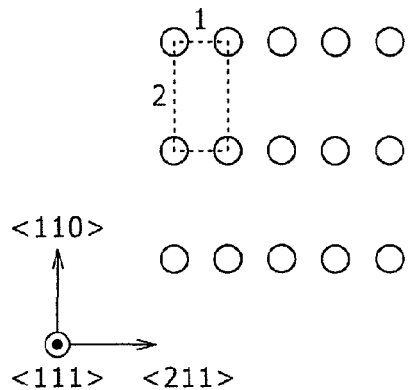
FIG. 15 is a diagram for explaining a (111)-1×1 structure.

In the (111)-1×1 structure during the high temperature thermal process, as the temperature is reduced from the high temperature, irregular atomic arrangements including a (111)-2×1 structure are formed on the surface. The (111)-2×1 structure is a structure in which the minimum unit of forming the atomic arrangement is 2 atomic distances×1 atomic distance. FIG. 14 schematically shows the (111)-2×1 structure and FIG. 15 schematically shows the (111)-1×1 structure.

When the temperature is further reduced, the structure returns to the (111)-1×1 structure again around 400° C. When the temperature is further reduced, the (111)-1×1 structure changes to another structure. Thus, by reducing the temperature from the high temperature side to the temperature near 400° C., it is possible to convert from the structure of irregular atomic arrangement including the (111)-2×1 structure of the polycrystalline silicon semiconductor layer 16 to the (111)-1×1 structure. The low-temperature thermal process is a process to convert the (111)-plane of the polycrystalline silicon semiconductor layer 16 into the (111)-1×1 structure. Therefore, the temperature of the low-temperature thermal process cannot be any temperature, but the process is a specified thermal process to reduce the temperature to a temperature near 400° C. as shown in FIG. 13, where the surface becomes the (111)-1×1 structure. This process is called a low-temperature thermal process because the growth temperature region of the III-V family compound semiconductor is between 400° C. and 800° C., and the temperature of the low-temperature thermal process is lower than this temperature.

The specific low-temperature thermal process is executed at a temperature between 350° C. and 450° C., and under an inert gas atmosphere such as hydrogen gas, nitrogen gas, argon gas, helium gas, or the like.

After the surface of the polycrystalline silicon semiconductor layer 16 is converted into the (111)-1×1 structure, a conversion process is executed to convert from the (111)-1×1-plane to the (111)-B-plane in which the III-V family compound semiconductor grows vertically to the plane and the minimum unit of forming the atomic arrangement is 2 atomic distances×2 atomic distances, not to the (111)-A-plane. The conversion process is executed by supplying a material including the V family element immediately after the low-temperature thermal process. The material including the V family element is preferably gas including N, P, As, and Sb. For example, arsine which is $AsH_3$ may be used. The conversion process is preferably executed at a temperature from 400° C. to 500° C. $AsH_3$ may be supplied with the hydrogen gas as a carrier gas and at a partial pressure of $1.3 \times 10^{-4}$ atm.

As an alternative to executing the conversion process to the (111)-B-plane immediately after the low-temperature thermal processing step for conversion to the (111)-1×1 structure, it is also possible to execute the process simultaneously with the low-temperature thermal processing step. Specifically, while the (111)-plane of the polycrystalline silicon semiconductor layer 16 is converted into the (111)-1×1 structure by the low-temperature thermal process around 400° C., the materials including the V family element may be supplied to convert the surface into the (111)-B-plane.

When the conversion into the (111)-B-plane is executed in this manner, next, a material gas including a III family element and a material gas including a V family element are alternately supplied to the polycrystalline silicon semiconductor layer 16, in order to form a thin film of the III-V family compound semiconductor. This process may be called alternating material supply modulation (or Flow rate Modulated Epitaxy: FME) because different material gases are alternately supplied. By executing the alternating material supply modulation (Flow rate Modulated Epitaxy), it is possible to prevent detachment, due to heat, of As adhered to the polycrystalline silicon semiconductor layer 16 in the process of converting into the (111)-B-plane. In addition, a supplementary advantage is achieved in that, even when there is a site where the conversion is not completed during the conversion from the (111)-1×1 structure to the (111)-B-plane, the surface may be re-formed into the (111)-B-plane.

Figure 16:
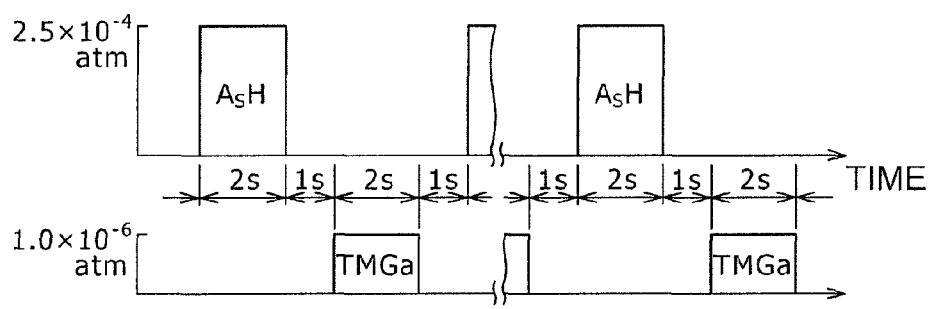
FIG. 16 is a diagram for explaining an alternating material supply modulation (Flow rate Modulated Epitaxy) in a preferred embodiment of the present invention.

FIG. 16 is a detailed time chart of the alternating material supply modulation (Flow rate Modulated Epitaxy). As shown in FIG. 16, arsine ($AsH_3$) which is the gas including the V family element is supplied for 2 seconds, trimethyl gallium (TMGa) which is the gas including the III family element is supplied for 2 seconds, and purge periods by the hydrogen gas of 1 second are interposed between the supply periods, resulting in a cycle of 2 s-1 s-2 s-1 s. The cycle is repeated few ten times. The partial pressure of $AsH_3$ may be set as $2.5 \times 10^{-4}$ atm with the hydrogen gas serving as the carrier gas, and a partial pressure of TMGa may be set to $1.0 \times 10^{-6}$ atm with the hydrogen gas serving as the carrier gas.

When the surface of the polycrystalline silicon semiconductor 16 exposed in the opening 22 of the low-temperature insulating film 20 is converted into the (111)-B-plane and a thin film of suitable 111-V family compound semiconductor is formed in this manner, next, a formation process of the core layer 34 is executed using the opening 22 as the nucleus of the growth. For the growth of the core layer 34, for example, metal organic vapor phase epitaxy (MOVPE), molecular beam epitaxy (MBE), or the like may be employed.

More specifically, using a low pressure horizontal MOVPE apparatus manufactured by Taiyo Nippon Sanso Corporation and having a manufacturing number of HR2339, a material gas including the III family element, a material gas including the V family element, and a material gas including an n-type impurity such as P for doping into the n-type may be supplied under a predetermined temperature and low pressure conditions. As the low pressure condition, for example, 0.1 atm may be employed. As the materials including the III family element, gas including B, Al, Ga, In, and Ti may be used, and, as the materials including the V family element, the gas including N, P, As, and Sb as described above may be used.

Here, because the core layer 34 of n-type GaAs is formed, trimethyl gallium (TMGa), arsine ($AsH_3$), monosilane gas ($SiH_4$) serving as the n-type dopant gas, and hydrogen gas serving as the carrier gas are supplied at a temperature of approximately 750° C. The partial pressure of TMGa may be $1\times10^{-6}$ atm, and the partial pressure of $AsH_3$ may be $2.5\times10^{-4}$ atm. The amount of $SiH_4$ may be determined by the setting of the n-type concentration, for example, a value from $7\times10^{17}/cm^3$ to $2.0\times10^{18}/cm^3$. The supply period of the material gas may be 20 minutes. The time period of 20 minutes is a time period for determining the growth height of the core layer 34, and may be arbitrarily set. Here, the target height is set at approximately 1 μm and the time is set to 20 minutes accordingly.

Figure 17:
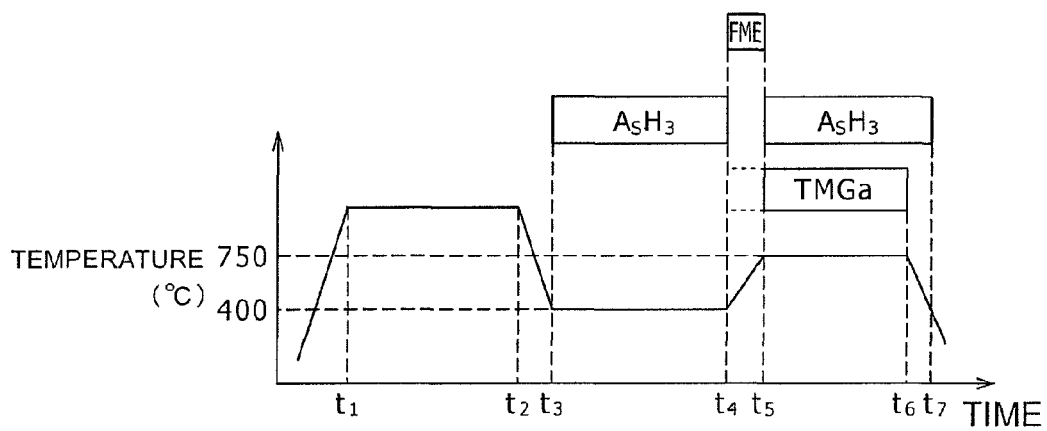
FIG. 17 is a time chart explaining the steps of FIG. 10.

FIG. 17 is a time chart showing the overall process. The horizontal axis represents time and the vertical axis represents temperature. Here, all of the steps are processed using the above-described low pressure horizontal MOVPE apparatus. A period from time $t_1$ to time $t_2$ is a period for removing the natural oxide film. Here, the temperature is maintained at 925° C. for 5 minutes and the hydrogen gas atmosphere is maintained. A period from time $t_2$ to time $t_3$ is a period to reduce the temperature to a temperature suitable for converting the (111)-plane of the polycrystalline silicon semiconductor layer 16 to the (111)-1×1 structure. Here, the temperature is reduced to 400° C. A period from time $t_3$ to time $t_4$ is a period of the low-temperature thermal process to convert into the (111)-B-plane simultaneously with the conversion to the (111)-1×1 structure. In this period, the processing temperature is maintained at 400° C., and, as described above, $AsH_3$ is supplied with the hydrogen gas serving as the carrier gas and at a partial pressure of $1.3\times10^{-4}$ atm.

A period from time $t_4$ to time $t_5$ is a period to increase the temperature from 400° C. to a temperature suitable for growth of GaAs. Here, the temperature is increased to 750° C. This period is also a period in which the alternating material supply modulation which is also called FME as describe above is executed. Therefore, in this period, as described above, with the hydrogen gas serving as the carrier gas, $AsH_3$ at the partial pressure of $2.5\times10^{-4}$ atm and TMGa at the partial pressure of $1.0\times10^{-6}$ atm are alternately supplied with a purge period therebetween. The first process is to supply TMGa and then, $AsH_3$ is supplied.

A period from time $t_5$ to time $t_6$ is a period in which the core layer 34 is grown. Here, the temperature is maintained at 750° C. for 20 minutes, and, as described above, with the hydrogen gas serving as the carrier gas, TMGa at the partial pressure of $1\times10^{-6}$ atm and $AsH_3$ at the partial pressure of $2.5\times10^{-4}$ atm are supplied, and $SiH_4$ is supplied such that the n-type concentration is $7\times10^{17}/cm^3$ to $2.0\times10^{18}/cm^3$. After the time $t_6$, preferably, the supply of TMGa is stopped, but the supply of $AsH_3$ is continued for a while.

Because Ga has a low melting temperature of 29° C., although the alternating material supply modulation (Flow rate Modulated Epitaxy) is described above as being executed during the temperature increase of the process temperature, alternatively, the above-described alternating material supply modulation (Flow rate Modulated Epitaxy) may be omitted. In other words, similar advantages as obtained by the alternating material supply modulation (Flow rate Modulated Epitaxy) may be obtained by executing the low-temperature process under $AsH_3$. Therefore, the process of the alternating material supply modulation (Flow rate Modulated Epitaxy) may be executed as necessary.

Figure 18:
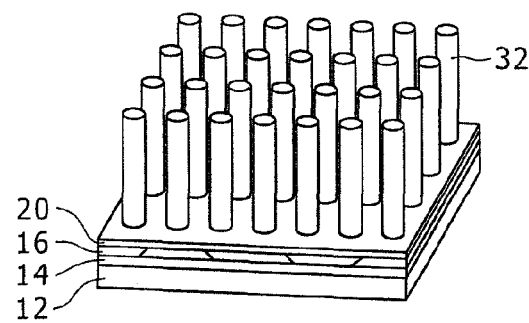
FIG. 18 is a diagram showing growth of a shell layer in a radial direction of the core layer following FIG. 10.
Figure 19:
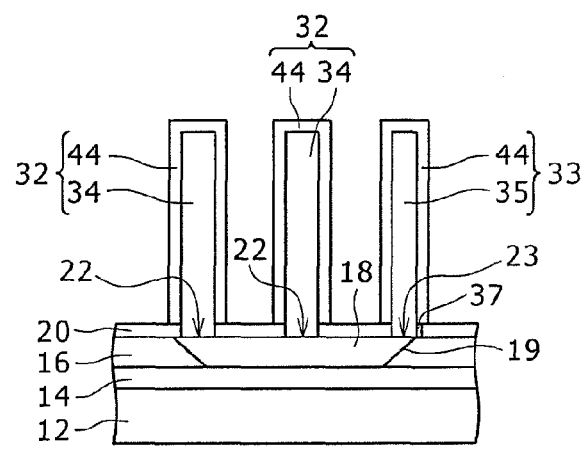
FIG. 19 is a partial cross sectional diagram along a thickness direction of the nanowire in FIG. 18.

When the core layer 34 is formed in this manner, the formation of the shell layer 44 is then executed. With the formation of the shell layer 44, the nanowire 32 is completed. FIGS. 18 and 19 are diagrams for explaining the formation of the shell layer 44. FIG. 18 is a perspective diagram and FIG. 19 is a partial cross sectional diagram along a thickness direction of the nanowire 32.

The formation of the shell layer 44 can be executed continuously after the time $t_6$ described with reference to FIG. 17, by reducing the temperature by 50° C. to 200° C. from the growth temperature of the core layer 34, and providing a sufficient purge time. By reducing the process temperature, the shell layer 44 can be grown primarily in the radial direction of the core layer 34. More specifically, at the temperature of 700° C. and with the hydrogen gas serving as the carrier gas, TMGa at the partial pressure of $1\times10^{-8}$ atm and $AsH_3$ at the partial pressure of $2.5\times10^{-4}$ atm are supplied, and dimethyl zinc gas is supplied as a p-type dopant gas. The amount of the dimethyl zinc gas may be defined depending on the setting of the p-type concentration, for example, $4.8\times10^{18}/cm^3$.

As shown in FIG. 19, the shell layer 44 is grown on the outer periphery of the core layer 34. That is, the shell layer 44 grows primarily in the radial direction of the core layer 34. In the opening 23 which extends over the grain boundary 19 also, the shell layer 44 grows in the radial direction of the core layer 35 above the portion 37 near the grain boundary 19. Therefore, in such a case also, the shell layer 44 becomes a nanowire 33 which completely covers the surroundings of the core layer 35. A thickness of the shell layer 44 may be, for example, 10 nm to 20 nm with the equivalent circle diameter of the core layer 34 being 50 nm.

Figure 20:
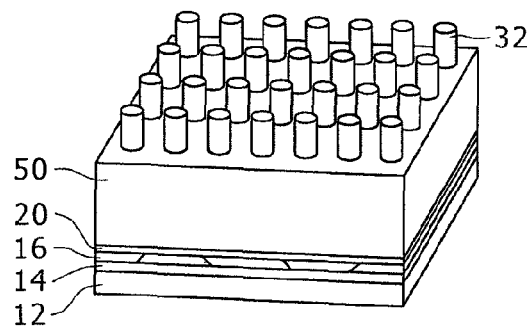
FIG. 20 is a diagram showing formation of an insulating layer following FIG. 18.
Figure 21:
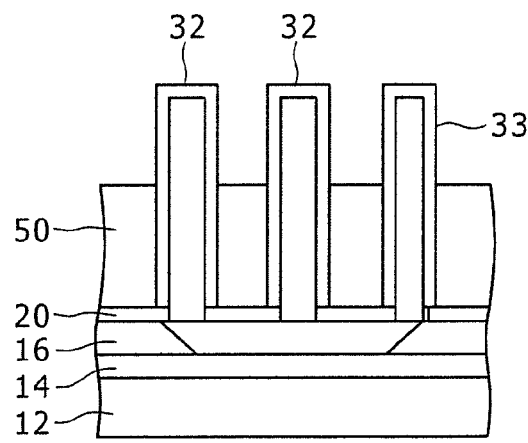
FIG. 21 is a partial cross sectional diagram along a thickness direction of the nanowire in FIG. 20.

When the nanowire 32 having the pn junction in the radial direction is formed in this manner, after a surface protection film is formed as necessary, a region between adjacent nanowires 32 is filled with an insulating layer 50. As the surface protection film, for example, an $Al_2O_3$ film formed by sputtering or the like may be used. The insulating layer 50 may be formed by applying liquid having SiN or the like as a component or a suitable insulating resin liquid by spin coating or the like. A height of the insulating layer 50 may be set to about 500 nm, which is half of the height of the nanowire 32 which is 1 μm. FIGS. 20 and 21 show this process. FIG. 20 is a perspective diagram and FIG. 21 is a partial cross sectional diagram along the thickness direction of the nanowire 32.

Figure 22:
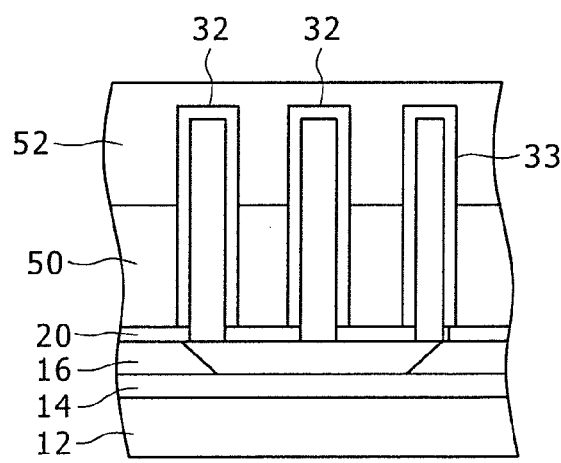
FIG. 22 is a partial cross sectional diagram along a thickness direction of the nanowire in a state where the upper electrode layer is formed following FIG. 20.

Next, if the surface protection film is formed over the nanowire 32, the surface protection film is removed and the upper electrode layer 52 serving as a transparent electrode film is formed. FIG. 22 shows this process. FIG. 22 corresponds to FIG. 2 which is referred to in the description of the semiconductor device 10. The upper electrode layer 52 is formed on the top of the insulating layer 50 and to completely include the nanowires 32 and 33 therein. As the upper electrode layer 52, an indium tin oxide (ITO) film may be formed by application through spin coating or the like. In this manner, the semiconductor device 10 described with reference to FIGS. 1-3 is obtained.

[Second Preferred Embodiment]

Figure 23:
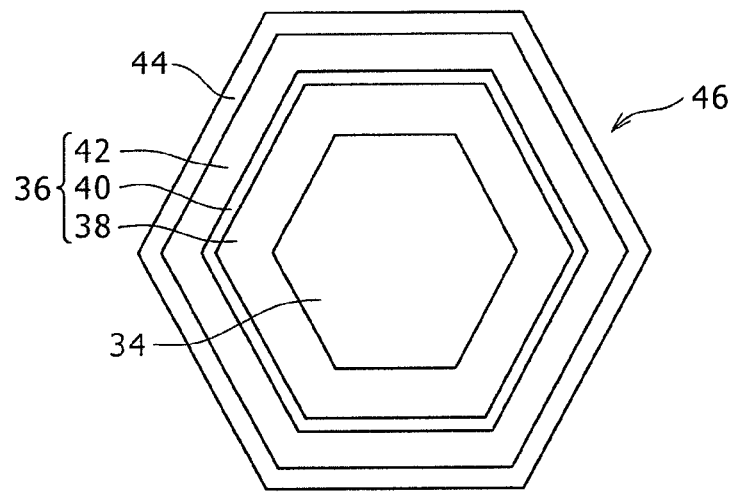
FIG. 23 is a cross sectional diagram of a core-shell structure including a quantum well layer in a direction perpendicular to an axial direction of a nanowire in another preferred embodiment of the present invention.
Figure 24:
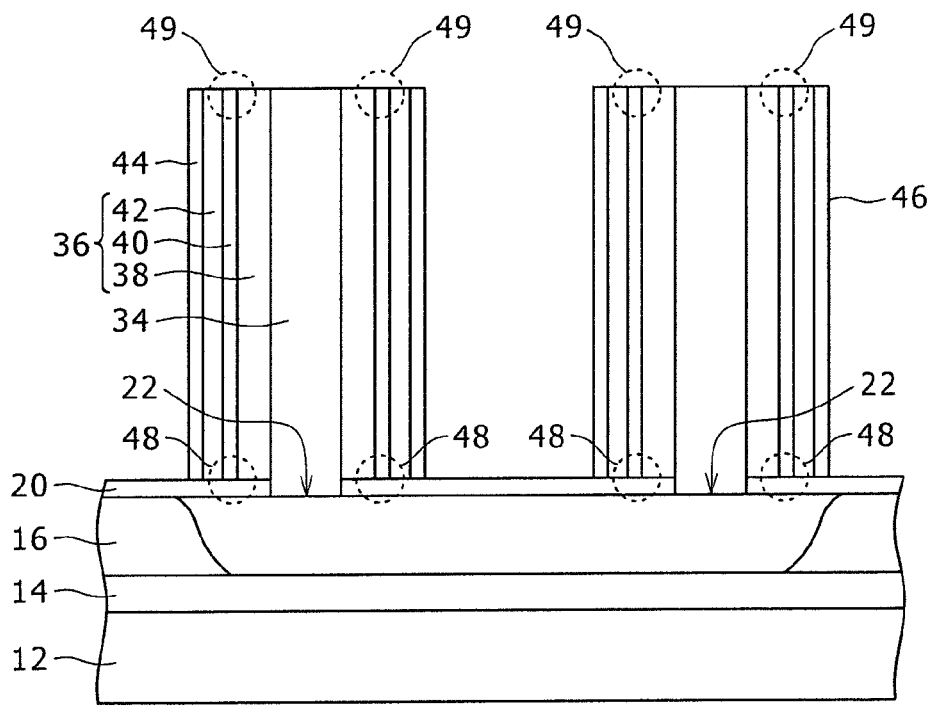
FIG. 24 is a partial cross sectional diagram along a thickness direction of the semiconductor device in the case of FIG. 23.

In the above-described embodiment, the use of a single junction of the core layer of n-type GaAs and the shell layer of p-type GaAs as the nanowire having the core-shell structure has been described. Here, the shell layer may be set as a multiple junction structure and a nanowire having a structure of a laser diode including a quantum well layer may be formed. FIGS. 23 and 24 show this process. FIG. 23 is a cross sectional diagram in a direction perpendicular to the axial direction of a nanowire 46 having the core-shell structure including the quantum well layer, and FIG. 24 is a partial cross sectional diagram along a thickness direction of the nanowire 46. The nanowire 46 comprises a core layer 34 of n-type GaAs, a first shell layer 36 which is a multiple-junction shell layer having a quantum well structure, and a second shell layer 44 of p-type GaAs. The first shell layer 36 comprises, from the side of the core layer 34 toward the side of the second shell layer 44, a first barrier layer 38 of n-type AlGaAs, a quantum well layer 40 of p-type GaAs, and a second barrier layer 42 of p-type AlGaAs. As described, the nanowire 46 has a 4-junction structure.

The n-type AlGaAs of the first barrier layer 38 has a larger band gap than the n-type GaAs of the core layer 34 and also has a larger band gap than the p-type GaAs of the quantum well layer 40. Similarly, the p-type AlGaAs of the second barrier layer 38 has a larger band gap than the p-type GaAs of the second shell layer 44 and also has a larger band gap than the p-type GaAs of the quantum well layer 40. The differences in the band gaps are inclined so that a band discontinuity in the quantum well layer 40 is reduced. Specifically, in the first barrier layer 38, the band gap is gradually reduced from the core layer 34 toward the quantum well layer 40, and, in the second barrier layer 42 also, the band gap is gradually reduced from the second shell layer 44 toward the quantum well layer 40.

The nanowire 46 is formed in a structure in which the shell layer 44 in the semiconductor device 10 described with reference to FIGS. 1-3 is replaced with the first shell layer 36 and the second shell layer 44. Therefore, in the manufacturing step of the semiconductor device 10, only the formation step of the shell layer differs, and the other steps are similar. That is, as shown in FIG. 24, the lower electrode layer 14 is provided over the glass substrate 12, the polycrystalline silicon semiconductor layer 16 is formed over the lower electrode layer 14, and the low-temperature insulating film 20 in which the openings 22 serving as the nuclei of the growth of the core layer 34 of the nanowire 46 are provided is formed over the polycrystalline silicon semiconductor layer 16.

As described above in relation to FIGS. 16 and 17, through the natural oxide film removal process, the conversion process from the (111)-plane to the (111)-1×1 structure, the conversion process from the (111)-1×1 structure to the (111)-B-plane, and the thin film formation process of the III-V family compound semiconductor called the FME, the core layer 34, the first shell layer 36, and the second shell layer 44 are formed. More specifically, in FIG. 17, after the time $t_6$, the formation of the first shell layer 36 and the second shell layer 44 are executed.

The formation of the first barrier layer 38, the quantum well layer 40, and the second barrier layer 42 forming the first shell layer 36 and the second shall layer 44 is executed by reducing the process temperature of the MOPVD apparatus to 700° C. and through the following procedure.

First, trimethyl aluminum (TMAl), trimethyl gallium (TMGa), arsine ($AsH_3$), and monosilane ($SiH_4$) are supplied along with hydrogen gas. With this process, n-type AlGaAs which is the first barrier layer 38 is formed primarily in the radial direction of the core layer 34. For a thickness of the first barrier layer 38 in the radial direction, it is sufficient that the thickness is greater than or equal to 5 nm, and the thickness is, for example, 22 nm.

Next, trimethyl gallium (TMGa), arsine ($AsH_3$), and dimethyl zinc are supplied along with the hydrogen gas. With this process, the p-type GaAs which is the quantum well layer 40 is formed primarily in the radial direction of the first barrier layer 38. For a thickness of the quantum well layer 40 in the radial direction, it is sufficient that the thickness is about 1 nm to about 50 nm, and the thickness is, for example, 22 nm.

Next, trimethyl aluminum (TMAl), trimethyl gallium (TMGa), arsine ($AsH_3$), and dimethyl zinc are supplied along with the hydrogen gas. With this process, the p-type AlGaAs which is the second barrier layer 42 is formed primarily in the radial direction of the quantum well layer 40. For a thickness of the second barrier layer 42 in the radial direction, it is sufficient that the thickness is greater than or equal to 5 nm, and the thickness is, for example, 22 nm.

Then, trimethyl gallium (TMGa), arsine ($AsH_3$), and dimethyl zinc are supplied along with the hydrogen gas. With this process, the p-type GaAs which is the second shell layer 44 is formed primarily in the radial direction of the second barrier layer 42. A thickness of the second shell layer 44 in the radial direction may be set, similar to the shell layer 44 of the semiconductor device 10 described with reference to FIG. 1, to 10 nm to 20 nm.

In these processes, the partial pressure of TMAl may be set to $7.5 \times 10^{-7}$ atm, the partial pressure of TMGa may be set to $8.2 \times 10^{-7}$ atm, and the partial pressure of $AsH_3$ may be set to $1.3 \times 10^{-4}$ atm. The concentration of the n-type dopant of the first barrier layer 38 may be set to a value from $7 \times 10^{17}/cm^3$ to $2.0 \times 10^{18}/cm^3$, and the concentrations of the p-type dopant for the quantum well layer 40, the second barrier layer 42, and the second shell layer 44 may be set to $4.8 \times 10^{18}/cm^3$.

The nanowire 46 having the laser diode structure including the quantum well layer 40 may be formed in this manner. In order to cause the structure to function as a laser oscillator, light must be repeatedly reflected in the axial direction of the nanowire 46 within the quantum well layer 40 to amplify the light. FIG. 24 shows reflection sections 48 and 49 which function as resonance mirrors for this purpose.

The first barrier layer 38, the quantum well layer 40, the second barrier layer 42, and the second shell layer 44 in regions other than the core layer 34 do not contact the opening 22, and contact the low-temperature insulating film 20. With this structure, due to a difference between an index of refraction of the quantum well layer 40 and an index of refraction of the low-temperature insulating film 20, an interface between the quantum well layer 40 and the low-temperature insulating film 20 functions as an optical reflection section 48. In addition, because an upper end of the quantum well layer 40 is ultimately in contact with the upper electrode layer 52, the interface between the quantum well layer 40 and the upper electrode layer 52 functions as the optical reflection section 49 due to a difference between an index of refraction of the quantum well layer 40 and an index of refraction of the upper electrode layer 52.

In this manner, for the nanowire 46 formed over the polycrystalline silicon semiconductor layer 16 over the glass substrate 12 and including the quantum well layer 40, a semiconductor device functioning as a laser diode can be formed by providing the insulating layer 50 and the upper electrode layer 52. Similar to the structure described with reference to FIG. 1, by connecting a drive power supply between the upper electrode layer 52 and the lower electrode layer 14, it is possible to emit light from this semiconductor device.

[Third Preferred Embodiment]

In the above-described embodiment, because GaAs is used as the core layer of the nanowire, the process temperature is 750° C., which is high, and quartz glass having a high heat endurance must be used as the glass substrate 12. If, for example, the nanowire is to be formed with a core layer of n-type InAs and a shell layer of p-type InAs, to realize a semiconductor device functioning as a light receiving element or the like, the process temperature can be reduced to about 540° C. With such a temperature, the glass substrate which is used in a liquid crystal display or the like may be utilized. For example, glass substrate manufactured by Corning Inc. and known by a product number of 7059 may be used.

Figure 25:
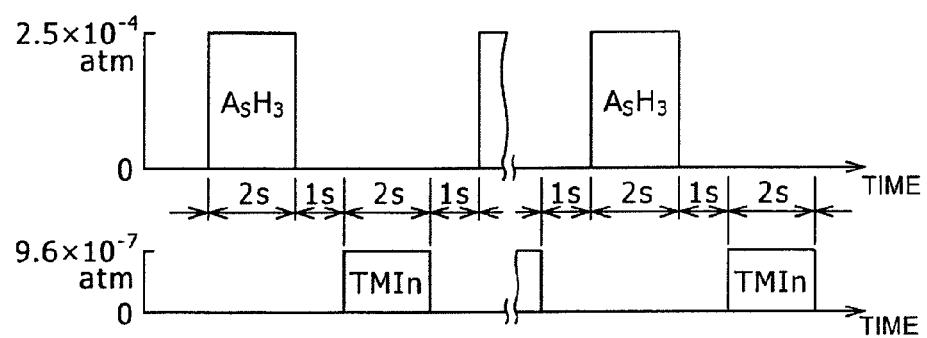
FIG. 25 is a diagram for explaining an alternating material supply modulation (Flow rate Modulated Epitaxy) in another preferred embodiment of the present invention.
Figure 26:
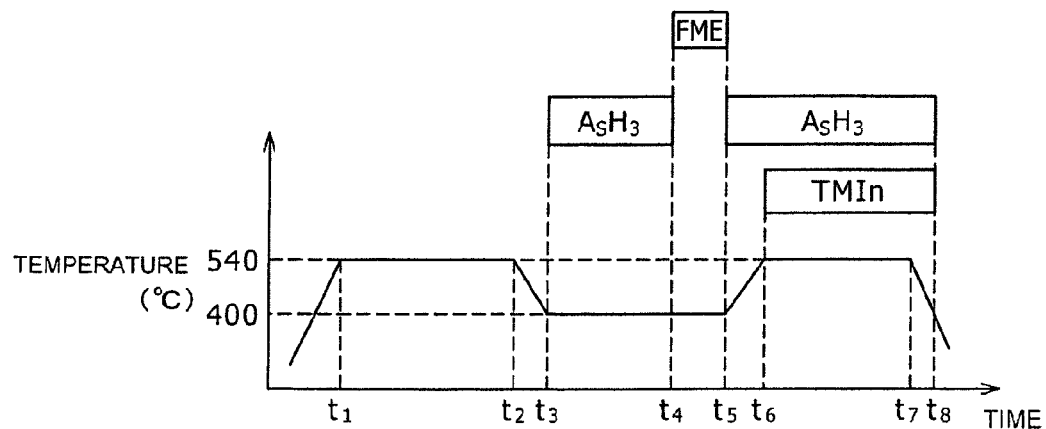
FIG. 26 is a time chart for explaining steps of nanowire formation in another preferred embodiment of the present invention.

FIGS. 25 and 26 are time charts for formation of the nanowire having a core-shell structure with a core layer of n-type InAs and a shell layer of p-type InAs. FIG. 25 corresponds to FIG. 16 and is a detailed time chart of the alternating material supply modulation (Flow rate Modulated Epitaxy), and FIG. 26 corresponds to FIG. 17 and is a time chart showing an overall nanowire formation process. As shown in FIG. 26, an upper limit of the process temperature can be set to 540° C. For the formation of InAs, trimethyl indium (TMIn) and arsine (AsH$_3$) are used. For the partial pressure of TMIn and the partial pressure of AsH$_3$, the values shown in FIG. 25 may be used for both the alternating material supply modulation (Flow rate Modulated Epitaxy) and for the formation of the core layer and the shell layer.

When the natural oxide film removal is not sufficient with the temperature of 540° C., in place of the thermal process under the inert gas atmosphere, other known natural oxide film removal methods must be employed. In addition, as shown in FIG. 26, the process of alternating material supply modulation (Flow rate Modulated Epitaxy) is preferably executed after the low-temperature thermal process step at 400° C. and under the same temperature condition.

In this manner, the nanowire can be formed over the polycrystalline silicon semiconductor layer using a general glass substrate to obtain a semiconductor device.

[Industrial Applicability]

The semiconductor device and a manufacturing method thereof according to the present invention can be used for a light-emitting element, a laser diode, a light receiving element, a light source element, a white light source element, a solar cell, a multiple-junction solar cell, a color sensor, a bipolar transistor, a MIS transistor, or the like.

[Explanation of Reference Numeral]

10 SEMICONDUCTOR DEVICE; 12 GLASS SUBSTRATE; 14 LOWER ELECTRODE LAYER; 16 POLYCRYSTALLINE SILICON SEMICONDUCTOR LAYER; 18 CRYSTAL GRAIN; 19 GRAIN BOUNDARY; 20 LOW-TEMPERATURE INSULATING FILM; 22, 23 OPENING; 30 LIGHT EMISSION; 32, 33, 46 NANOWIRE; 34, 35 CORE LAYER; 36 FIRST SHELL LAYER; 37 PORTION NEAR THE GRAIN BOUNDARY; 38 FIRST BARRIER LAYER; 40 QUANTUM WELL LAYER; 42 SECOND BARRIER LAYER; 44 (SECOND) SHELL LAYER; 48, 49 REFLECTION SECTION; 50 INSULATING LAYER; 52 UPPER ELECTRODE LAYER; 60 DRIVE POWER SUPPLY

The invention claimed is:

1. A semiconductor device, comprising:
    a glass or film-like substrate;
    a polycrystalline silicon semiconductor layer formed with a (111)-plane parallel to a plane of the substrate;
    an insulating film with openings which covers the (111)-plane of the polycrystalline silicon semiconductor layer and in which a plurality of openings having a smaller area than an area of crystal grain of polycrystalline silicon over the (111)-plane are formed; and
    a plurality of nanowires which are formed of a III-V family compound semiconductor and which extend vertical to the (111)-plane of the polycrystalline silicon semiconductor layer at the opening of the insulating film with openings serving as a nucleus.

2. The semiconductor device according to claim 1, wherein the nanowire is a nanowire having a core-shell structure and comprises:
    a core layer which extends vertical to the (111)-plane of the polycrystalline silicon semiconductor layer from the opening of the insulating film with openings; and
    at least one shell layer which extends in a radial direction vertical to a longitudinal direction of the core layer and which covers the core layer.

3. The semiconductor device according to claim 2, wherein the nanowire comprises:
    a core layer which is formed of a III-V family compound semiconductor having a first conductivity type; and
    a shell layer which is formed of a III-V family compound semiconductor having a second conductivity type.

4. The semiconductor device according to claim 2, wherein the nanowire comprises:
    a core layer which is formed of a III-V family compound semiconductor having a first conductivity type;
    a first shell layer which is formed of a III-V family compound semiconductor including a quantum well layer; and
    a second shell layer which is formed of a III-V family compound semiconductor having a second conductivity type.

5. The semiconductor device according to claim 3, further comprising:
    a lower electrode layer which is provided between the substrate and the polycrystalline silicon semiconductor layer; and
    an upper electrode layer which is formed of a transparent conductive material and which covers the shell layer.

6. The semiconductor device according to claim 4, further comprising:
    a lower electrode layer which is provided between the substrate and the polycrystalline silicon semiconductor layer; and
    an upper electrode layer which is formed of a transparent conductive material which covers the second shell layer.

7. A method of manufacturing a semiconductor device, comprising:
    a step of forming a polycrystalline silicon semiconductor layer with a (111)-plane parallel to a plane of a glass or film-like substrate;
    a step of forming an insulating film with openings which covers the (111)-plane of the polycrystalline silicon semiconductor layer and in which a plurality of openings having a smaller area than an area of crystal grain of polycrystalline silicon over the (111)-plane are formed; and a nanowire forming step in which a plurality of nanowires which are formed of a III-V family compound semiconductor and which extend vertical to the (111)-plane of the polycrystalline silicon semiconductor layer are formed at the opening of the insulating film with openings serving as a nucleus, wherein the nanowire forming step comprises:
a step of executing a low-temperature thermal process under a predetermined condition which is defined in advance, to convert from the (111)-plane of the polycrystalline silicon semiconductor layer into a (111)-1×1-plane in which a minimum unit of forming an atomic arrangement is 1 atomic distance×1 atomic distance; and
a step of supplying a material including a III family element or a material including a V family element, to convert from the (111)-1×1-plane of the polycrystalline silicon semiconductor layer into a (111)-A-plane in which the minimum unit of forming the atomic arrangement is 2 atomic distances×2 atomic distances and the III family element is placed on a surface or a (111)-B-plane in which the minimum unit of forming the atomic arrangement is 2 atomic distances×2 atomic distances and the V family element is placed on a surface.

8. The method of manufacturing the semiconductor device according to claim 7, wherein the nanowire forming step comprises:
a core layer forming step in which a core layer which extends vertical to the (111)-plane of the polycrystalline silicon semiconductor layer from the opening of the insulating film with openings is formed; and
a shell layer forming step in which at least one shell layer which extends in a radial direction vertical to a longitudinal direction of the core layer and which covers the core layer is formed.

9. The manufacturing method of the semiconductor device according to claim 8, wherein the nanowire forming step comprises:
a core layer forming step in which a core layer which is formed of a III-V family compound semiconductor having a first conductivity type is formed; and
a shell layer forming step in which a shell layer which is formed of a III-V family compound semiconductor having a second conductivity type is formed.

10. The manufacturing method of the semiconductor device according to claim 8, wherein the nanowire forming step comprises:
a core layer forming step in which a core layer which is formed of a III-V family compound semiconductor having a first conductivity type is formed;
a first shell layer forming step in which a first shell layer which is formed of a III-V family compound semiconductor including a quantum well layer is formed; and
a second shell layer forming step in which a second shell layer which is formed of a III-V family compound semiconductor having a second conductivity type is formed.

11. The manufacturing method of the semiconductor device according to claim 9, further comprising:

a step of providing a lower electrode layer between the substrate and the polycrystalline silicon semiconductor layer; and
a step of providing an upper electrode layer which is formed of a transparent conductive material and which covers the shell layer.

12. The manufacturing method of the semiconductor device according to claim 10, further comprising:

a step of providing a lower electrode layer between the substrate and the polycrystalline silicon semiconductor layer; and
a step of providing an upper electrode layer which is formed of a transparent conductive material and which covers the second shell layer.

* * * * *